United States Patent [19]

Pessa et al.

[11] Patent Number: 4,876,218

[45] Date of Patent: Oct. 24, 1989

[54] METHOD OF GROWING GAAS FILMS ON SI OR GAAS SUBSTRATES USING ALE

[75] Inventors: Markus Pessa; Harry Asonen; Jukka Varrio; Arto Salokatve, all of Tampere, Finland

[73] Assignee: Oy Nokia Ab, Helsinki, Finland

[21] Appl. No.: 248,845

[22] Filed: Sep. 26, 1988

[30] Foreign Application Priority Data

Sep. 29, 1987 [FI] Finland .................................. 874260

[51] Int. Cl.$^4$ ..................... H01L 21/20; H01L 21/203
[52] U.S. Cl. ........................... 437/107; 148/DIG. 25; 148/DIG. 72; 148/DIG. 97; 148/DIG. 169; 156/611; 437/111; 437/112; 437/132; 437/945; 437/976
[58] Field of Search ..................... 148/DIG. 25, 29, 56, 148/65, 72, 97, 110, 127, 149, 160, 169, 33; 156/610–615; 437/108, 110, 111, 112, 126, 132, 174, 247, 936, 945, 976

[56] References Cited

U.S. PATENT DOCUMENTS

| 4,058,430 | 11/1977 | Suntola et al. | 156/611 |
| 4,575,462 | 3/1986 | Dobson et al. | 437/107 |
| 4,767,494 | 8/1988 | Kobayashi et al. | 156/613 |

OTHER PUBLICATIONS

Briones et al., "Low-Temperature Growth . . . Modulated Molecular Beam Epitaxy", Jpn. J. Appl. Phys., vol. 26, No. 7, Jul. 1987, pp. L1125–L1127.

Horikashi et al., "Low-Temperature Growth . . . Modified Molecular Beam Epitaxy", Jpn. J. Appl. Phys., vol. 25, No. 10, Oct. 1986, pp. L868–L870.

Hiyamizu et al., "MBE/Growth of InGaAs-InGaAlAs . . .", J. Cryst. Growth, vol. 81, No. 1–4, Feb. 1987, pp. 349–358.

Gerard et al., "High Quality . . . Low-Temperature Modulated-Fluxes Molecular Beam Epitaxy", Appl. Phys. Lett., vol. 53, No. 7, Aug. 15, 1988, pp. 568–570.

Primary Examiner—Brian E. Hearn
Assistant Examiner—William Bunch
Attorney, Agent, or Firm—Finnegan, Henderson, Farabow, Garrett & Dunner

[57] ABSTRACT

The invention relates to a method of growing a GaAs film on the surface of a Si or GaAs substrate by exposing the growing surface of the substrate in a vacuum to at least one vapor beam containing the Ga elementary component of the GaAs compound, and to at least one vapor beam containing the As elementary component of the GaAs compound. The method is characterized by the steps of (A) growing a GaAs buffer layer by alternately applying the elements of the GaAs compound to the surface of a substrate heated to a first temperature one atom layer at a time, whereby in the formation of each atom layer the growing surface is exposed to a vapour beam containing one elementary component of the GaAs compound only; and (B) heating the substrate to a second temperature higher than the first temperature, and growing another GaAs layer on the buffer layer by applying both of the elementary components of the GaAs compound simultaneously.

3 Claims, 3 Drawing Sheets

METHOD OF GROWING GAAS FILMS ON SI OR GAAS SUBSTRATES USING ALE

The invention relates to a molecular beam epitaxy (MBE) method of growing a GaAs film on a Si or GaAs substrate.

Gallium arsenide layers grown on silicon substrates represent a promising opportunity to combine the best features of Si and GaAs technologies. An advantage of a silicon substrate is the lower price and better mechanical strength as compared with an expensive and fragile GaAs substrate. When using a silicon substrate, it is possible to integrate on one and the same silicon substrate not only GaAs circuits but also other conventional circuits.

When a GaAs film is grown on a silicon substrate with a different chemical composition, the most critical problem is the lattice mismatch between gallium arsenide and silicon due to the differing lattice constants, causing a high dislocation density and surface defect density in the grown films. The high defect density, in turn, makes the GaAs film unsuitable for use as a device layer and results in a poor yield.

When growing GaAs layers by a conventional MBE method (MBE=Molecular Beam Epitaxy) on Si substrates, GaAs nucleates as three-dimensional islands which are coherently strained, i.e., are free of misfit dislocations. This nucleation process is complex and nonuniform, depending on the growth temperature ($T_S$), growth rate, and substrate orientation. As the amount of deposited GaAs increases, the islands grow and coalesce generating dislocations to accommodate the lattice mismatch. One may infer from observations presented in a number of publications that approximately by 7 nm thickness and for $T_S \geq 200°$ C. the islands begin to coalesce and the transitions from strained to dislocated states take place.

The misfit dislocations are of two different types. They are either pure edge dislocations (type I) or mixed dislocations (type II). The type I dislocations are more effective for the accommodation of the strain caused by lattice misfit than type II dislocations. In addition, the type II dislocations likely act as sources for the generation of threading dislocations which propagate deep into the GaAs layer and thus degrade the material quality. For a type I dislocation, the dislocation line runs along the interface and it is only the interfacial region that is degraded.

An article "Low-Temperature Growth of GaAs and AlAs-GaAs Quantum Well Layers by Modified Molecular Beam Epitaxy" by Y. Horikoshi et al., Japanese Journal of Applied Physics, Vol 25, No. 10, Oct. 1986, p. L868–L870, recites a so called pulsed mode of MBE, called MEE (Migration Enhanced Epitaxy) by the authors. In MEE, the molecular beams produced from two effusion cells are alternately pulsed by opening and closing shutters positioned between the cells and the substrate. In the article, GaAs films were grown on GaAs substrates at a very low temperature, even at 200° C., in a two-dimensional layer-by-layer fashion with good crystallographic and electrical properties if the number of Ga atoms supplied in each pulse is equal or close to the number of reaction sites in the surface of the growing film. Arsenic is transferred to the surface by the subsequent pulse of $As_4$ molecules, while the Ga cell is shut. Arsenic is incorporated into the lattice structure via catalytic decomposition and reactions with Ga. This kind of deposition results in the formation of approximately one molecular layer per operational cycle, thicker films being attained by repeated cycling.

The MEE method disclosed in the article is, however, slower than MBE, and the shutters in present day MBE growing devices, designed to be opened at the outset of the MBE process and to be closed at the end thereof, do not withstand to be opened and closed approximately once a second as required in MEE.

The object of the present invention is to provide a method which avoids the drawbacks of prior methods and which provides GaAs films of higher quality than previously particularly on a silicon substrate.

This object is achieved by means of a molecular beam epitaxy (MBE) method according to the invention, which is mainly characterized by what is disclosed in claim 1.

The basic idea of the invention is that a GaAs buffer layer relatively thin as compared with the total thickness of the GaAs film is first grown on a substrate at a relatively low temperature by the MEE method prior to the growing of the rest of the film, that is, a device layer, at a higher temperature by the traditional MBE method.

This, in turn, is based on the Applicant's observation that the early stage of the growing is very important to the properties of the final GaAs layer when the GaAs layer is grown on a silicon substrate (GaAs/Si heteroepitaxy). As stated above, the initial nucleation in traditional MBE growing takes place through three-dimensional islands. On the other hand, when the buffer layer is grown by MEE, the growth can be regarded as more planar, as a layer-by-layer stacking, i.e., the nucleation is almost two-dimensional and parallel to the Si/GaAs interface. Two-dimensional growth, in turn, seems to cause reduction in lattice strain by creating mismatch dislocations (type I) which have a relatively low range of action and which as a result lead to the reduction of disadvantageous threading dislocations penetrating deep into the GaAs layer and to the confinement of the defects formed in the growth within a narrower interface region than in MBE.

By the method according to the invention, it is possible to produce GaAs films of higher quality than previously on a Si substrate even with very small buffer layer thicknesses, the minimum thickness of the buffer layer being approximately 4 to 5 nm (40 to 50 Å). It has been observed that GaAs films grown by the method according to the invention have a low surface defect density and a high electron mobility, a film of 1.85 $\mu$m nearly possessing the properties of a GaAs bulk crystal.

By the method according to the invention, high quality GaAs films have been obtained on a GaAs substrate, too. In general, there are plenty of surface defects or oval defects (200 to 500 per $cm^2$) on the surface of a GaAs substrate, a major part of which are transferred to the surface of the GaAs film in MBE. As to growth on GaAs substrates, "Synthesis of III-V Compound Semiconductor Materials", D.G. Collins, American Institute of Physics Conference Proceedings No. 138, New York 1986, p. 208–222, is cited as prior art. In the method according to the invention, the defect density on a GaAs film surface is 10 to 20/$cm^2$. Even without clean room facilities, a surface defect density of 70/$cm^2$ is obtained.

In the method according to the invention, the MEE stage is very short and a major part of the growth takes place at the MBE stage, so the method does not strain the shutters and is well applicable to MBE growing devices presently in use.

The method according to the present invention will be described in more detail in the following with reference to the attached drawings, wherein FIGS. 1A and 1E illustrate the different stages of the method according to the invention;

The present method is used and applied in MBE growing devices well-known in the art and in general use. As the invention is not directly concerned with the growing devices, the structure of the device will not be discussed more closely herein.

Figure 1A:
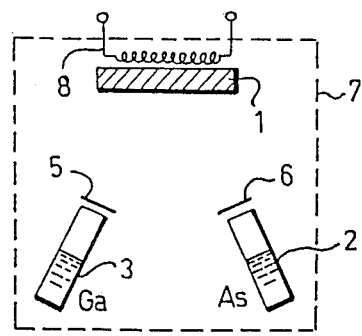

FIG. 1A illustrates schematically effusion cells 2 and 4 disposed in a growing chamber 7 under vacuum, and a substrate 1. The effusion cell 3 contains the Ga elementary component of the GaAs compound, e.g., as Ga atoms, and the effusion cell 4 contains the As elementary component, e.g., as $As_4$ molecules. The substances contained in the effusion cells are heated to evaporate them, and the vapour is directed to the underside of the substrate. The passage of the vapour from the effusion cells can be allowed and prevented by means of special shutters, illustrated in the figures by shutters 5 and 6. The substrate 1 is heated to the growing temperature e.g. by means of an electric resistance 8.

FIG. 1A shows the initial situation in which the substrate 1 has been placed in the vacuum chamber 7 and heated to a first growing temperature ranging from 100° to 500° C. Ga and As contained in the effusion cells 2 and 3 are heated to evaporation temperatures, which are of the order of 300° C. (As) and 800° C. (Ga). The shutters 5 and 6 prevent the vapour from escaping from the cells.

Figure 1B:
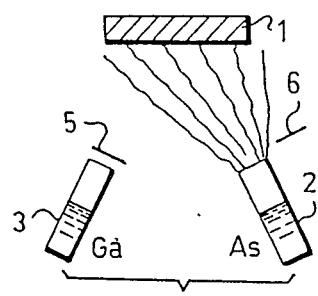
Figure 1C:
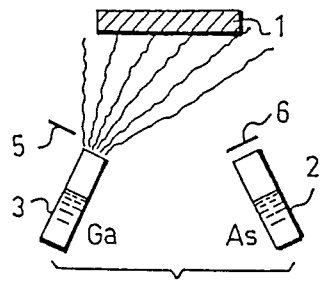

FIGS. 1B and 1C illustrate the formation of the GaAs buffer layer according to the MEE method. In FIG. 1B, the shutter 6 is opened in front of the As cell and the vapour beam ($As_4$ molecules) is allowed to act on the surface of the substrate 1 for a period of time which is required for the formation of one atom layer. This time period is not critical, since the As atoms are not bound to one another, but the excess arsenic is removed through re-evaporation, and the growing surface grows by one atom layer only. After this time period (of the order of 1 s), the shutter 6 is closed and the shutter 5 is opened (FIG. 1C).

In FIG. 1C, a vapour beam containing Ga atoms is allowed to act on the growing surface until a number of Ga atoms corresponding to a single atom layer reaches the growing surface. The time during which the shutter 5 is kept open is more critical, since the Ga atoms are also bound to one another, and are thus able to grow the GaAs film by more than one atom layer. After this time the shutter 5 is closed and the shutter 6 is opened for the following As atom layer.

Figure 1D:
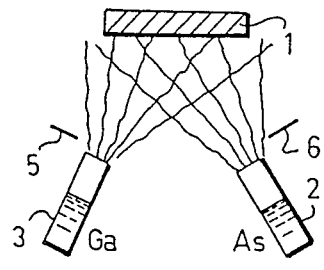
Figure 1E:
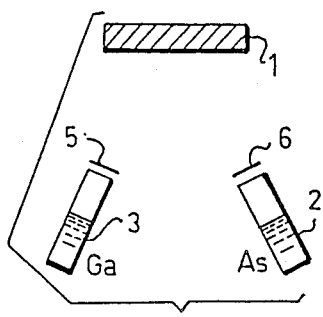

The steps of FIGS. 1B and 1C are repeated, thus growing the GaAs film by one atom layer at a time until the desired GaAs buffer layer thickness is obtained. Thereafter the MBE method illustrated in FIGS. 1D and 1E is began to be applied.

After the growth of the buffer layer, the substrate 1 is heated to a second growth temperature ranging from 500° to 700° C. Then both of the shutters 5 and 6 are opened, so that the Ga and As beams act simultaneously on the growing surface. The shutters are kept open throughout the MBE step until the desired GaAs film thickness is obtained. Thereafter both shutters are closed and the process is completed.

Figure 2:
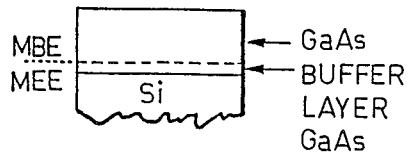
FIG. 2 illustrates a GaAs film grown according to the invention.

FIG. 2 shows a GaAs film grown on a silicon substrate. The thickness of the buffer layer may vary within the range from 4 to 300 nm, preferably from 50 to 150 nm. The total thickness of the GaAs film is typically 1 to 2 μm.

EXAMPLE 1

The experiment consisted of preparing Si(100) substrates tilted 4° towards [011], growth of GaAs layers, and examining the samples by Rutherford backscattering/channelling (RBS), X-ray diffraction and Hall mobility measurements.

Si substrates $8 \times 8$ mm² in size were mounted on a Mo heater block (indium free) and placed into the MBE system. Before GaAs growing the substrates were heated in the growth chamber at 850° C. for 30 min.

The films were grown to thicknesses ranging from 0.45 to 1.9 μm both by means of the MEE/MBE method according to the invention and, by way of comparison, by the MBE method alone using a three-chamber MBE system of Kryovak Ltd.

In MBE-growth the first GaAs layer of about 40 nm was deposited at substrate temperature $TS \approx 280°$ C. at the growth rate of 0.2 μm/h. Then the substrate was heated up to 600° C., and the growth rate was increased to 0.8 μm/h.

In MEE/MBE-growth a buffer layer of about 100 nm was first deposited by MEE at $TS \approx 300°$ C. at the growth rate of 0.5 μm/h. After depositing this buffer layer, growth was continued by MBE at the temperature of 600° C. and the rate of 1.0 μm/h.

The RBS/channelling measurements were carried out using a 2.3-MeV $^4$He ion beam with an angular divergence smaller than 0.02° C. and produced from a 2.5-MeV Van de Graaf generator. The ion beam was aligned with respect to the [100] crystal axis of GaAs. The alignment was reproducible with an accuracy better than 0.05° C. The X-ray diffraction measurements were made by using a standard one-crystal X-ray diffractometer equipped with a Cu anode. The electron Hall mobility was also measured for one of the samples.

Figure 3:
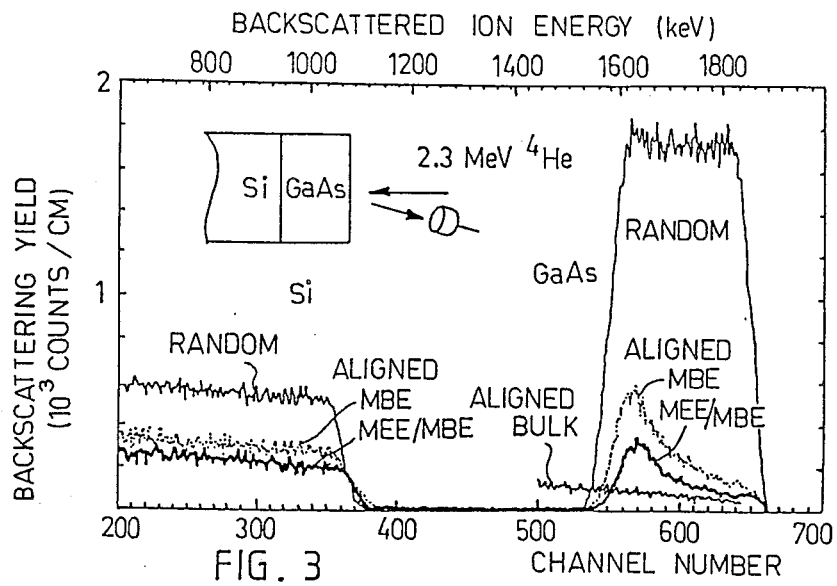
FIGS. 3 to 5 illustrate results obtained by the Rutherford backscattering measurement for a GaAs film grown by the method according to the invention.

FIG. 3 shows backscattering spectra from 0.45 and 0.48 μm - thick GaAs layers grown by MEE/MBE and MBE, respectively, on Si(100) substrates, and from a bulk GaAs(100) wafer.

In the RBS experiment, the density of displaced Ga and As atoms, $N_D$, relative to the total density of atoms in (virgin) bulk GaAs, N, as a function of depth x is given by $$N_D/N = [H_A(x) - H_V(x)]/[H_R(x) - H_V(x)] \quad (1)$$

where $H_A$ and $H_V$ denote the aligned backscattering yields from a GaAs film and a bulk GaAs crystal, respectively. $H_R$ stands for the yield obtained from random orientation. It should be noted that Equation (1) is valid to a reasonable accuracy only for the surface region of a sample from x=0 to 1 μm due to a dechannelling effect which increases the yield at greater depths.

Figure 4:
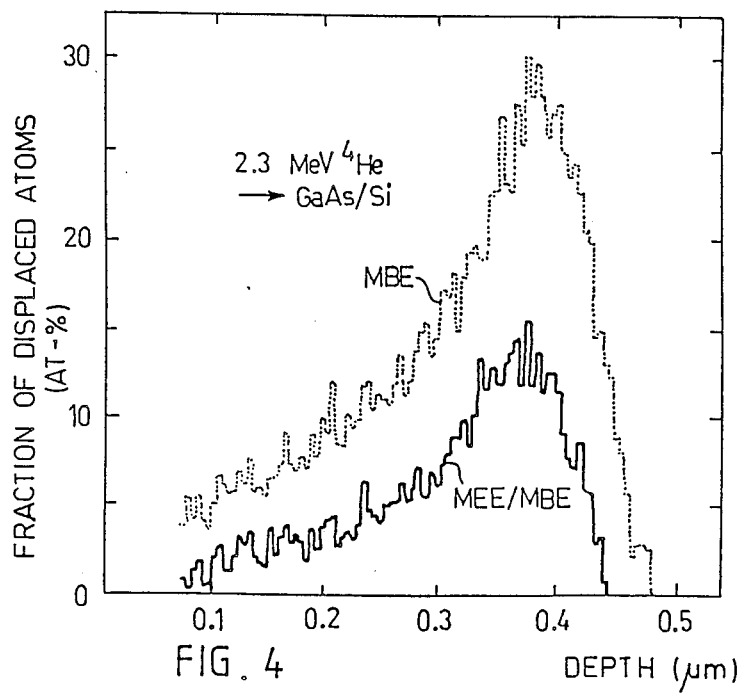

FIG. 4 shows the ratio $N_D/N$ (Eq. (1)) as a function of depth for the film thicknesses of 0.45 μm (lower curve) and 0.48 μm (upper curve), as calculated from the spectra of FIG. 3.

Figure 5:
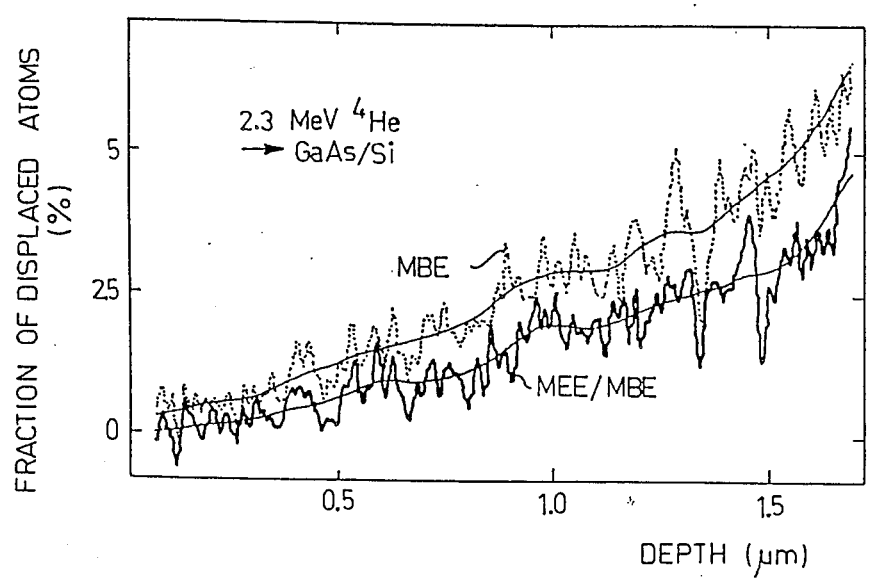

FIG. 5 shows the ratio $N_D/N$ for film thicknesses of 1.85 μm (lower curve) and 1.89 μm (upper curve) after correcting the dechannelling effect. Regular curves are obtained by convoluting the original spectrum with a Gaussian distribution of 20 keV width.

Following Table I gives minimum (100) aligned yields in Rutherford backscattering and full widths at half maximum (FWHM) of (400) X-ray diffraction.

TABLE I

| Film Thickness (in μm) | Growth technique | GaAs $X_{min}$ | Si $X_{min}$ | FWHM (in min of arc) |
|---|---|---|---|---|
| 0.45 | MEE/MBE | 0.041 | 0.35 | 7.2 |
| 0.48 | MBE | 0.073 | 0.50 | 9.6 |
| 1.06 | MBE | 0.038 | 0.50 | — |
| 1.41 | MBE | 0.039 | 0.51 | — |
| 1.85 | MEE/MBE | 0.033 | 0.38 | 3.7 |
| 1.89 | MBE | 0.036 | 0.49 | 4.7 |
| virgin GaAs | bulk crystal | 0.033 | — | 2.7 |
| Si substrate | bulk crystal | — | 0.031 | — |

FIGS. 3 to 5 show that the quality of the GaAs layers improves with increasing thickness, and that the quality of initial deposits strongly affects the rate of evolution of crystal structure. The density of displaced atoms as a function of x together with the values of $X_{min}$ and FWHM provide clear evidence that the GaAs buffer layer formed by MEE markedly improves crystal structure through the entire film. Effects of MEE are seen in the most straight-forward way for the thin films in FIG. 4, where no correction for dechannelling is needed. Of particular interest is the observation that low $X_{min}$ of 0.033, the same as that of a bulk GaAs crystal, is obtained for the layer of thickness of only 1.85 μm when grown by the method according to the invention (MEE/MBE).

In order to evaluate the electrical quality of the 1.85 μm - thick GaAs layer (MEE/MBE), the surface region of the thickness of 0.5 μm was doped with Si at the level of $N_d - N_a \approx 4 \times 10^{17}$ cm$^{-3}$. Van der PauwHall measurements of this film gave the electron mobility $\mu_H$ of 3100 cm$^2$/Vs at room temperature. For comparison, the n-type MBE GaAs/GaAs films doped at the same level normally exhibit $\mu_H$ of about 3300 cm$^2$/Vs.

EXAMPLE 2

GaAs films 1 μm in thickness were grown on a GaAs substrate by MBE (600° C., 1 μm/h) and by MEE/MBE (first a buffer layer of 50 to 200nm MEE/300° C., then MBE/600° C.).

Oval defects observed on the microscopic image were of two main types: A-type defects close to each other and minor, individual B-type defects. The MEE/MBE films contained almost entirely A-type defects having macroscopic core particles. The A-type defects sometimes had gallium droplets at their centres instead of dust particles. The number of A-type defects was very low, usually below 10 per sample, and it was practically the same for all the samples. The MBE films contained mainly B-type defects which possessed small or no core particles at all. As a consequence, the reduced defect density in MEE/MBE growth is accomplished by eliminating B-type defects; i.e., the effect of small particles and other microscopic surface contaminants on the substrate.

In addition, many of the pre-growth surface particles and other surface contaminants which developed oval defects in MBE growth do not do so in MEE/MBE growth. This reduction in defects may be associated with the formation of a (nearly) complete monoatomic layer achieved by each MEE pulse. Readily migrating Ga atoms in the arsenic-free environment are expected to wet the surface rather homogeneously. The subsequent pulse of As$_4$ was long enough to allow the As atoms to occupy all the equilibrium crystal structure positions on the Ga saturated surface. It is therefore conceivable that if growth is commenced via layer-by-layer stacking of atoms, small precipitates on the initial surface of the substrate may become "buried" underneath and cause no oval defects, as the film grows thicker. This view is substantiated by observations of different defect types present in MBE and MEE/MBE films.

The description and the drawings attached thereto are only intended to illustrate the idea of the invention. In its details, the invention may vary within the scope of the attached claims.

We claim:

1. A molecular beam epitaxy method of growing a GaAs film on the surface of a Si or GaAs substrate by exposing the growing surface of the substrate in a vacuum to at least one vapour beam containing the Ga elementary component of the GaAs compound, and to at least one vapour beam containing the As elementary component of the GaAs compound, characterized by the steps of
   (A) growing a GaAs buffer layer on the substrate by alternately applying the elements of the GaAs compound to the surface of a substrate heated to a first temperature one atom layer at a time, whereby in the formation of each atom layer the growing surface is exposed to a vapour beam containing one elementary component of the GaAs compound only; and
   (B) subsequently heating the substrate to a second temperature higher than the first temperature, and growing another GaAs layer on the buffer layer by applying both of the elementary components of the GaAs compound simultaneously.

2. A method according to claim 1, characterized in that the first temperature is in the range 100°-600° C. and the second temperature in the range 500°-700° C.

3. A method according to claim 1 or 2, characterized in that the minimum thickness of the buffer layer is about 4 to 5 nm.

* * * * *